(12) United States Patent
Scholz (10) Patent No.: US 9,077,375 B2
(45) Date of Patent: Jul. 7, 2015

(54) DTC SYSTEM WITH HIGH RESOLUTION PHASE ALIGNMENT

(71) Applicant: Intel Mobile Communications GmbH, Neubiberg (DE)

(72) Inventor: Markus Scholz, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/976,677

(22) PCT Filed: Dec. 20, 2012

(86) PCT No.: PCT/EP2012/076389
§ 371 (c)(1),
(2) Date: Sep. 13, 2013

(87) PCT Pub. No.: WO2013/092867
PCT Pub. Date: Jun. 27, 2013

(65) Prior Publication Data
US 2014/0002288 A1    Jan. 2, 2014

(30) Foreign Application Priority Data

Dec. 21, 2011  (DE) .......................... 10 2011 089 422
Dec. 21, 2011  (DE) .......................... 10 2011 089 426
Jul. 16, 2012   (DE) .......................... 10 2012 212 397

(51) Int. Cl.
*H03M 1/82* (2006.01)
*H03M 1/66* (2006.01)
*G04F 10/00* (2006.01)

(52) U.S. Cl.
CPC ........ *H03M 1/66* (2013.01); *H03M 1/82* (2013.01); *G04F 10/005* (2013.01)

(58) Field of Classification Search
CPC ... H03M 1/0836; H03M 1/12; H03M 7/3022; H03M 1/1019; H03M 1/1095; H03M 1/1215; H03M 1/1225; H03M 5/08; H03M 13/15; H03M 13/151; H03M 13/2707; H03M 13/2764; H03M 1/1038; H03M 1/1042; H03L 2207/50; H03L 7/085; H03L 7/08; H03L 7/091; H03L 7/099; H03L 7/1976; H03L 7/06; H03L 2207/06; H03L 7/0991; H03L 7/18; H03L 7/0891; H03L 7/095; H03L 7/193; H03L 7/0995; H03L 7/101
USPC .................. 341/143, 152; 327/156, 159, 276
See application file for complete search history.

(56) References Cited

U.S. PATENT DOCUMENTS 5,489,864 A * 2/1996 Ashuri .......................... 327/161
6,100,736 A * 8/2000 Wu et al. ....................... 327/159

(Continued)

OTHER PUBLICATIONS

Chen, P. et al: "FPGA Vernier Digital-to-Time Converter with 1.58 ps Resolution and 59.3 Minutes Operation Range" In: IEEE Transactions on Circuits and Systems I, vol. 57, Issue 6, Jun. 2010, pp. 1134-1142.

(Continued)

*Primary Examiner* — Linh Nguyen
(74) *Attorney, Agent, or Firm* — Eschweiler & Associates, LLC (57) ABSTRACT

Some embodiments relate to a transmitting arrangement that includes a digital to time converter (DTC) with a reference generator and a modulation generator coupled to first and second input terminals thereof. A feedback path, which includes a phase and/or frequency measurement block and a phase and/or frequency correction block, is coupled between an output terminal of the DTC converter and the second input terminal of the DTC. The feedback path can help determine a phase or frequency correction word that can be applied to a modulation control word provided by the modulation generator to tune or correct the modulation control word before it reaches the DTC. In this way, the transmitting arrangement facilitates extremely accurate phase alignment and helping achieve extremely accurate signal transmission.

15 Claims, 8 Drawing Sheets

(56) References Cited

U.S. PATENT DOCUMENTS

| | | | |
|---|---|---|---|
| 6,392,496 B1* | 5/2002 | Lee et al. | 331/17 |
| 6,720,959 B2* | 4/2004 | Haroun et al. | 345/213 |
| 7,006,024 B2* | 2/2006 | Keaveney et al. | 341/143 |
| 8,339,295 B2* | 12/2012 | Nagaraj et al. | 341/111 |
| 2007/0110194 A1 | 5/2007 | de Obaldia et al. | |
| 2007/0189431 A1* | 8/2007 | Waheed et al. | 375/376 |
| 2007/0283316 A1* | 12/2007 | Stengel | 717/101 |
| 2008/0317188 A1 | 12/2008 | Staszewski et al. | |
| 2009/0190694 A1 | 7/2009 | Kobayashi | |
| 2010/0183066 A1* | 7/2010 | Chen et al. | 375/239 |
| 2010/0260242 A1 | 10/2010 | Abe et al. | |
| 2010/0323643 A1 | 12/2010 | Ridgers | |
| 2011/0064150 A1 | 3/2011 | Uozumi et al. | |
| 2011/0148490 A1 | 6/2011 | Lee et al. | |
| 2011/0156783 A1* | 6/2011 | Pavlovic et al. | 327/159 |
| 2011/0267120 A1* | 11/2011 | Ravi et al. | 327/159 |
| 2011/0304361 A1* | 12/2011 | Henzler et al. | 327/105 |
| 2012/0268184 A1* | 10/2012 | Baumann et al. | 327/277 |
| 2012/0288044 A1* | 11/2012 | Roberts et al. | 375/350 |

OTHER PUBLICATIONS

Choi, Y.-C. et al: "A fully digital polar transmitter using a digital-to-time converter for high data rate system" In: IEEE Radio-Frequency Integration Technology RFIT 2009, Jan. 2009, pp. 56-59.

Pavlovic, N. et al: "A 5.3 GHz Digital-to-Time-Converter-Based Fractional-N All-Digital PLL" In: IEEE Solid-State Circuits Conference Digest of Technical Papers (ISSCC), Feb. 2011, pp. 54-56.

Roberts, G. W. et al: "A Brief Introduction to Time-to-Digital and Digital-to-Time Converters" In: IEEE Transactions on Circuits and Systems II, vol. 57, No. 3, Mar. 2010, pp. 153-157.

International Search Report and Written Opinion of the International Searching Authority dated May 22, 2013 for International Application No. PCT/EP2012/076405. 11 Pages.

International Search Report and Written Opinion of the International Searching Authority dated Jun. 6, 2013 for International Application No. PCT/EP2012/076389. 16 Pages.

U.S. Appl. No. 13/976,649, filed Jun. 27, 2013 with USPTO.

International Search Report and Written Opinion of the International Searching Authority dated May 22, 2013 for International Application No. PCT/EP2012/076405. 5 Pages.

International Search Report and Written Opinion of the International Searching Authority dated May 22, 2013 for International Application No. PCT/EP2012/076389. 14 Pages.

Notice of Allowance Dated Feb. 5, 2015 U.S. Appl. No. 13/976,649.

* cited by examiner

180
DTC SYSTEM WITH HIGH RESOLUTION PHASE ALIGNMENT

BACKGROUND

A digital to time converter (DTC) is an electrical circuit that translates a digital bit stream into an outgoing waveform. Typical DTCs, for example, convert a digital bit stream of logical "1"s and "0"s into an outgoing waveform such that the frequency and/or phase of the waveform varies in time to mirror the bit-pattern of the incoming digital bit stream.

Although DTCs are widely used, existing DTCs suffer from several shortcomings. For example, some DTCs do not achieve high resolution phase alignment between the phase contained in the incoming digital signal and the phase of the outgoing waveform. Others DTCs rely on complex analog circuitry, which can require a large area on chip and can consume significant power. To limit these and other shortcomings, the inventors have devised improved DTC systems with high resolution phase alignment as set forth herein.

DETAILED DESCRIPTION

One or more implementations of the present invention will now be described with reference to the attached drawings, wherein like reference numerals are used to refer to like elements throughout. The drawings are not necessarily drawn to scale.

Figure 1:
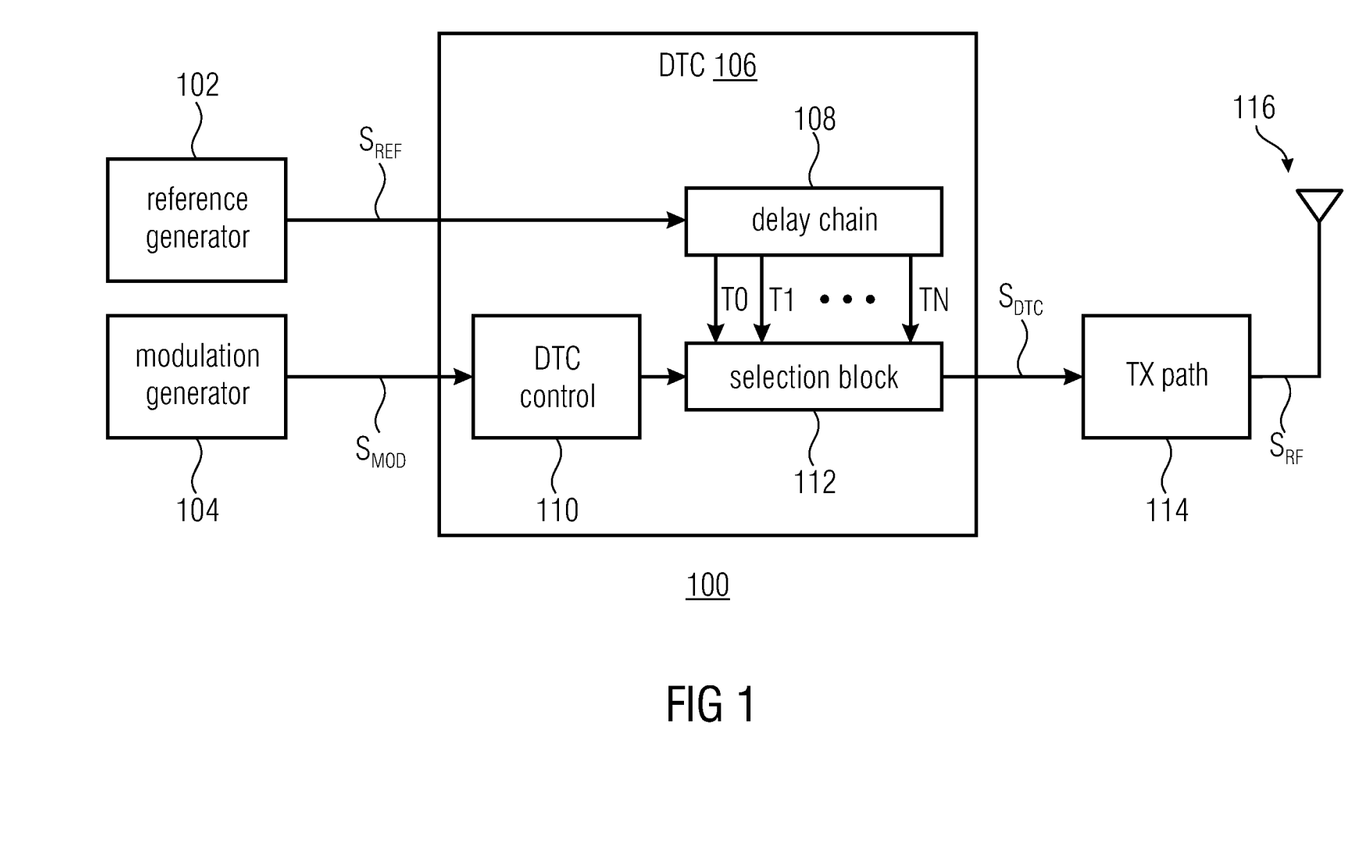
FIG. 1 is a block diagram illustrating a transmitting arrangement that suffers from some shortcomings.

FIG. 1 shows a block diagram for a transmitting arrangement 100 that suffers from some shortcomings. The transmitting arrangement includes a reference generator 102 to provide a reference signal, $S_{REF}$, which can represent a carrier wave for example; and also includes a modulation generator 104, which can provide a modulation control word $S_{MOD}$, indicative of modulation to be applied to the carrier wave for example. The reference signal, $S_{REF}$, and modulation control word, $S_{MOD}$, are provided to a digital to time converter (DTC) 106, which includes a number of delay elements arranged in series to form a delay chain 108. The delay elements in the delay chain 108 successively delay the reference signal, $S_{ref}$, to provide a number of successively delayed signals (T0, T1, ... TN). Based on the modulation control word $S_{MOD}$, a DTC controller 110 induces changes in a selection block 112 in the DTC, wherein the selection block 112 then selects different edges or pulses of the delayed signals (T0, T1, ..., TN) to implement the desired modulation in an output DTC signal, $S_{DTC}$. The output DTC signal can then be provided to a transmission path 114 that amplifies and optionally filters the $S_{DTC}$ signal before transmitting an RF signal corresponding to the $S_{DTC}$ signal over an RF antenna 116.

Although FIG. 1's transmitting arrangement 100 is sufficient in many instances, the inventors have appreciated that such a transmitting arrangement suffers from a shortcoming in that the phase and/or frequency of the actual modulation present in the output DTC signal can differ slightly from the desired modulation (e.g., as specified in modulation control word $S_{MOD}$). For example, the output DTC signal can have an actual phase offset (or an actual frequency) that is slightly less than or slightly more than specified in the modulation control word, $S_{MOD}$. Such differences can arise in some cases due to manufacturing variations among a batch of chips with transmitting arrangements thereon, due to normal process variation in the fabrication facility.

Figure 2:
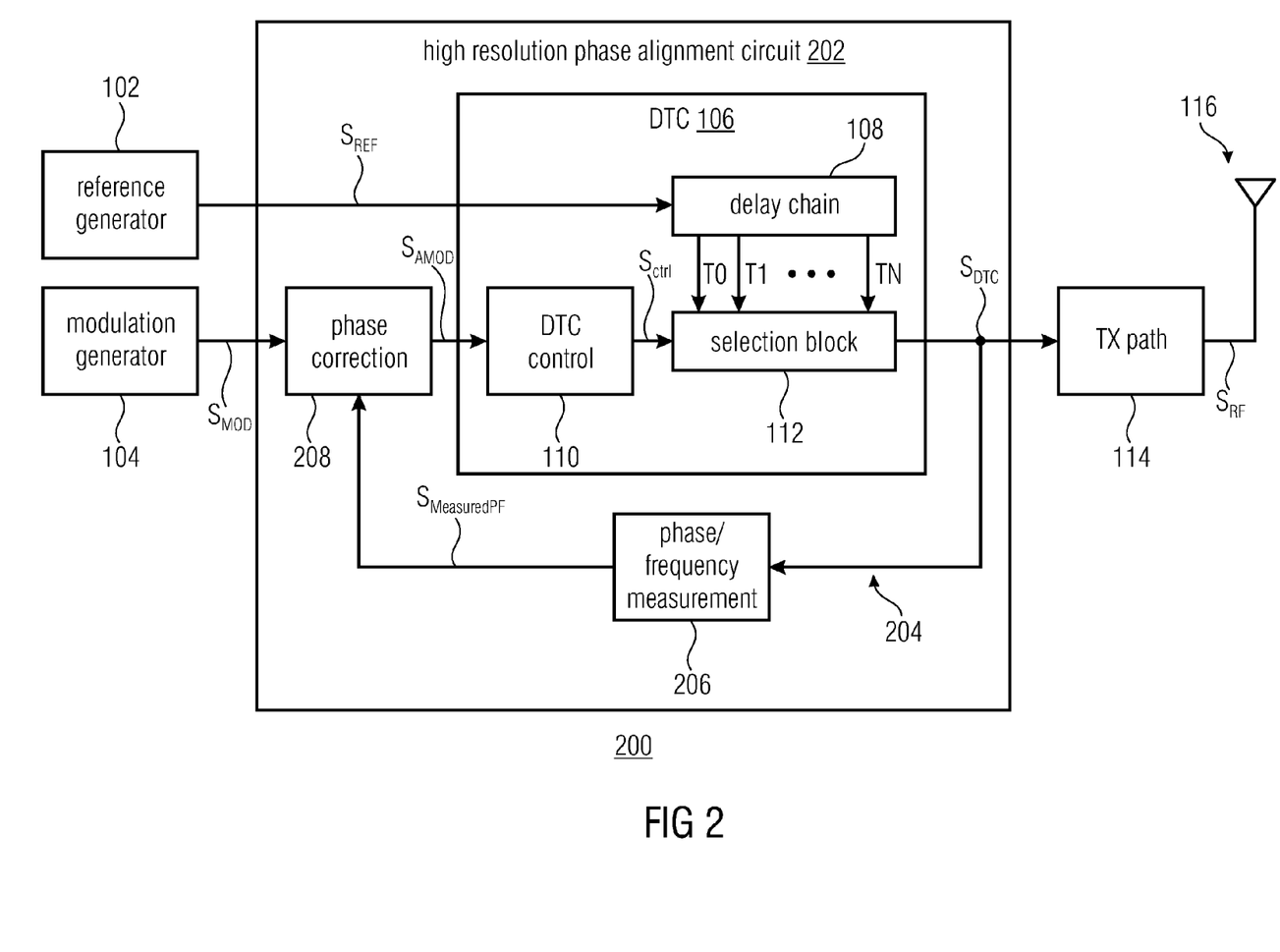
FIG. 2 illustrates a transmitter that makes use of high resolution phase alignment circuit in accordance with some embodiments.

FIG. 2 shows a block diagram for a transmitting arrangement 200 that makes use of high resolution phase alignment circuit 202 in accordance with the present disclosure. To remedy the shortcomings discussed in FIG. 1 and/or other shortcomings, this transmitting arrangement 200 includes a feedback path 204 that includes a phase and/or frequency measurement block 206 and a phase and/or frequency correction block 208. In many embodiments, the feedback path 204 helps determine a phase or frequency correction word, which can be applied to the original modulation control word $S_{MOD}$, to tune or correct the original modulation word before it reaches the DTC 106. Hence, the resulting adjusted modulation control word, $S_{AMOD}$, (which is based on the original modulation control word $S_{MOD}$ and the phase or frequency correction word) can account for manufacturing variations and/or other conditions affecting frequency or phase (e.g., temperature or supply voltage). In this way, the transmitting arrangement facilitates extremely accurate phase alignment and helping achieve extremely accurate signal transmission.

During operation, the transmitting arrangement 200 operates in two different modes: a calibration mode and an active mode (e.g., transmission mode). More particularly, during the calibration mode, the DTC control block 110 provides the control signal, $S_{ctrl}$, according to a predetermined stimulus pattern which induces different frequencies or phase offsets corresponding to expected modulation signals, $S_{MOD}$. The control signal applies this pre-determined stimulus pattern by selecting different combinations of edges or pulses from the delayed signals (T0, T1, ..., TN) and thereby outputting different frequencies and/or phase changes on DTC output. For each combination of selected edges, the phase/frequency measurement block 206, which is often implemented as a digital frequency counter, measures the phase and/or frequency of the resultant DTC signal for some predetermined gating time. The phase correction block 208 then compares the actual frequencies or phases measured by the phase or frequency measurement block 206 to the original frequency and/or phase specified in the control signal (which mimicks expected modulation signals, $S_{mod}$). The phase correction block 208 then stores the differences between the originally specified values and actual values for later use. These differences between the originally specified and actual frequency and/or phase values may also be referred to as "calibration values" in some contexts, and are stored in a memory element, such as a look-up table in the phase correction block 208 for example. Because the various combinations of edges are measured on the actual transmitting arrangement 200 during calibration mode, the measured frequencies and/or phases differences are extremely accurate in that they account for process variation and other effects that are specific to the individually calibrated transmitting arrangement 200.

Subsequently, during the active mode, the modulation generator 104 can provide a modulation control word, $S_{mod}$, indicating a modulation to be applied to the reference signal, $S_{ref}$. For example, the modulation control word can specify frequency modulation or phase modulation, and/or combinations thereof. Upon receiving the original modulation control word, $S_{mod}$, the phase correction block 208 can then determine the amount of adjustment, if any, to account for the conditions measured during calibration. For example, in some embodiments, the phase correction block 208 can comprise an adder (or other arithmetic block) that adds the original modulation control word $S_{MOD}$ and a corresponding calibration value stored in a look-up-table value to provide an adjusted modulation control word $S_{AMOD}$. Because adjusted modulation control word, $S_{AMOD}$, accounts for phases and/or frequencies that are measured during calibration with extremely high precision, extremely precise signals can be transmitted from the transmitting arrangement 200. This limits the number of transmission errors and thereby improves communication.

An advantage of this transmitting arrangement 200 is that the DTC 106 is capable of outputting DTC signal, $S_{DTC}$, at a high frequency (e.g., RF frequency), but still with extremely high precision. Therefore, the transmission path 114 does not need mixers or other up-conversion elements to up-convert the frequency of the DTC signal. This saves chip area and power relative to conventional solutions. In addition, because of the streamlined architecture of the transmitting arrangement 200, the high resolution phase alignment circuit 202 can be implemented as a single integrated circuit in some implementations. In other implementations, however, the high resolution phase alignment circuit 202 can also be implemented as a number of integrated circuits arranged in an integrated circuit package or on a PCB board, for example.

Although FIG. 2's high resolution phase alignment circuit 202 has been illustrated and described in the context of a transmitting arrangement 200 where the DTC performs up-conversion, it will be appreciated that high resolution phase alignment circuits are not limited to transmission arrangements or up-conversion applications but can be used for any system where high resolution phase alignment is used. For example, the high resolution phase alignment circuit 202 is equally applicable to down-conversion techniques, wherein the average RF output frequency on the DTC output will be at least slightly lower, and possibly much lower, than the input RF frequency (e.g., reference signal, Sref). Thus, FIG. 2's transmitting arrangement 200 represents one practical example where the high resolution phase alignment techniques can be used for up-conversion, but in no way limits the potential applications of the disclosed high resolution phase alignment techniques.

Figure 3:
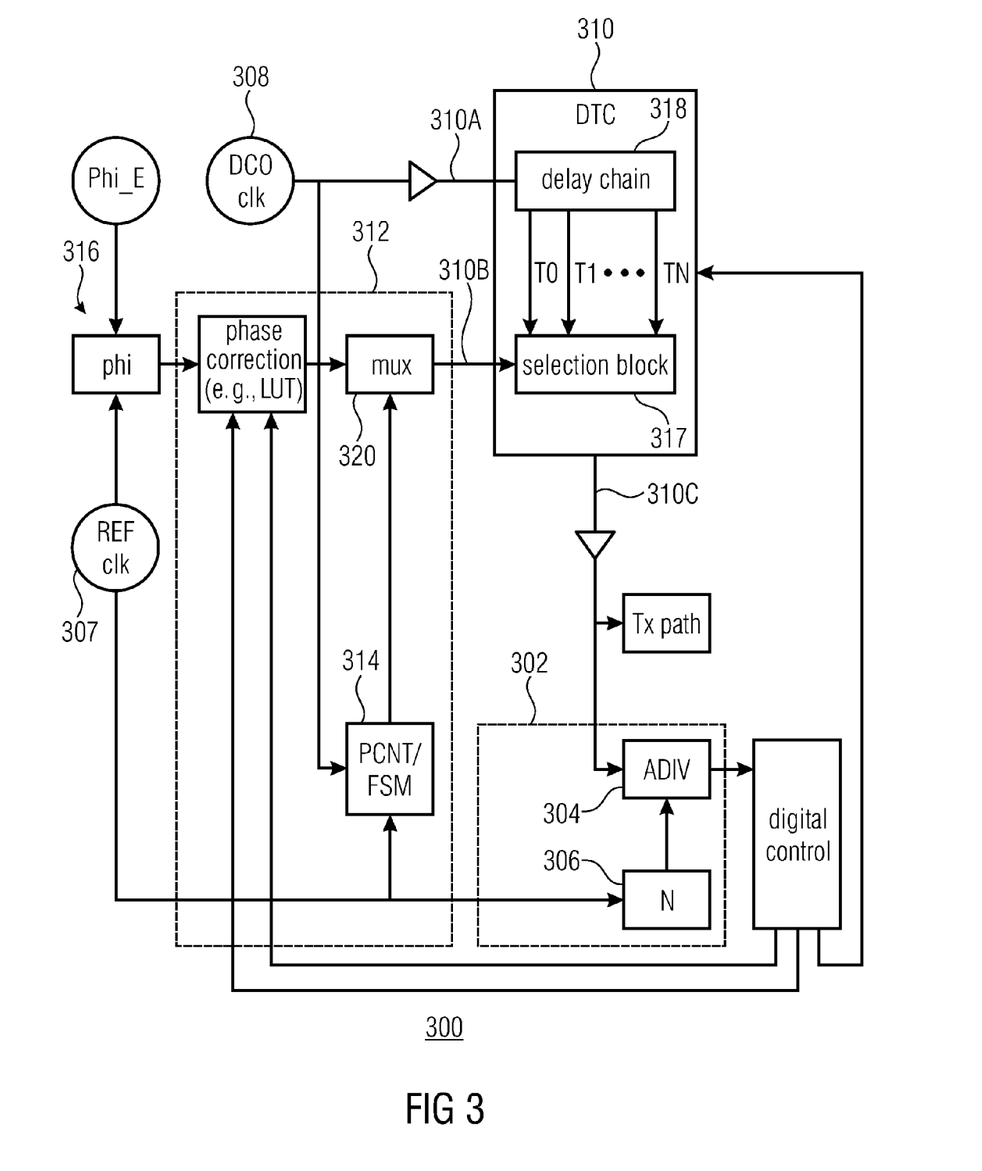
FIG. 3 illustrates a high resolution phase alignment circuit in accordance with some embodiments.

FIG. 3 shows another implementation of a high resolution phase alignment circuit 300 in accordance with some embodiments. This phase alignment circuit 300 has a phase measurement block 302 which includes a counter 304, which has a counting period set by an N-bit divider 306 and reference clock 307. This counter 304 is a particularly efficient way of measuring phase and/or frequencies compared to conventional approaches. For example, one binary result of counter can measure frequency (but not phase), while two binary results can measure frequency and/or phase.

Like FIG. 2's implementation, the alignment circuit 300 includes a reference signal generator 308. In FIG. 3's example, the reference signal generator 308 is a digitally controlled oscillator (DCO), which delivers a DCO signal to a first input terminal 310A of a DTC 310. In some embodiments, the reference signal represents a carrier wave, and can be at a frequency of approximately 4 GHz, for example.

A phase control block 312 controls the output state of a multiplexer 320 depending on whether the alignment circuit 300 is in a calibration mode or an active mode. During calibration, the output of the multiplexer 320 corresponds to a parallel counter or finite state machine 314, which applies predetermined stimulus patterns to a second input terminal 310B of the DTC 310. These predetermined stimulus patterns induce a selection block 317 in the DTC 310 to output predetermined combinations of pulses or edges from delay elements in the delay chain 318. This generates a corresponding DTC signal on an output terminal 310C of the DTC, where the DTC signal has a time-varying frequency or phase, depending on the edges or pulses that were selected. Although the predetermined combinations of edges are expected to exhibit a pre-determined phase and/or frequency, the phase and/or frequency can, in reality, differ from this predetermined phase and/or frequency because of process variation, temperature variation, and supply voltage variation, among others. Therefore, the counter 304 counts the pulses in the DTC signal during some predetermined time period to measure the actual phase and/or frequency of the DTC signal with high accuracy. These count values can then be stored in a RAM, register, table, binary buffer, or other memory element; and go through some processing (e.g., formula on page 9 further herein) to obtain a phase or frequency correction word. This phase or frequency control word is then stored in a lookup table or other memory element, and can subsequently be used by phase control block 312.

During active transmission mode, the output of the multiplexer 320 is switched to correspond to a modulation controller 316, such as a baseband controller for example. This modulation controller 316 provides a modulation control word, Phi, to the phase control block 312. The phase control block 312 then accesses the look-up table, which contains values for the modulation control word and corresponding phase or frequency correction words which were obtained during the calibration mode. The phase control block then adjusts the current modulation control word based on the corresponding phase or frequency correction word and passes the resulting adjusted modulation control word to the DTC. The selection block 317 then, based on the adjusted modulation control word, determines which pulses or edges are to be selected from the DTC 310 to deliver a DTC signal with the phase and/or frequency specified by the original modulation control word.

Figure 4:
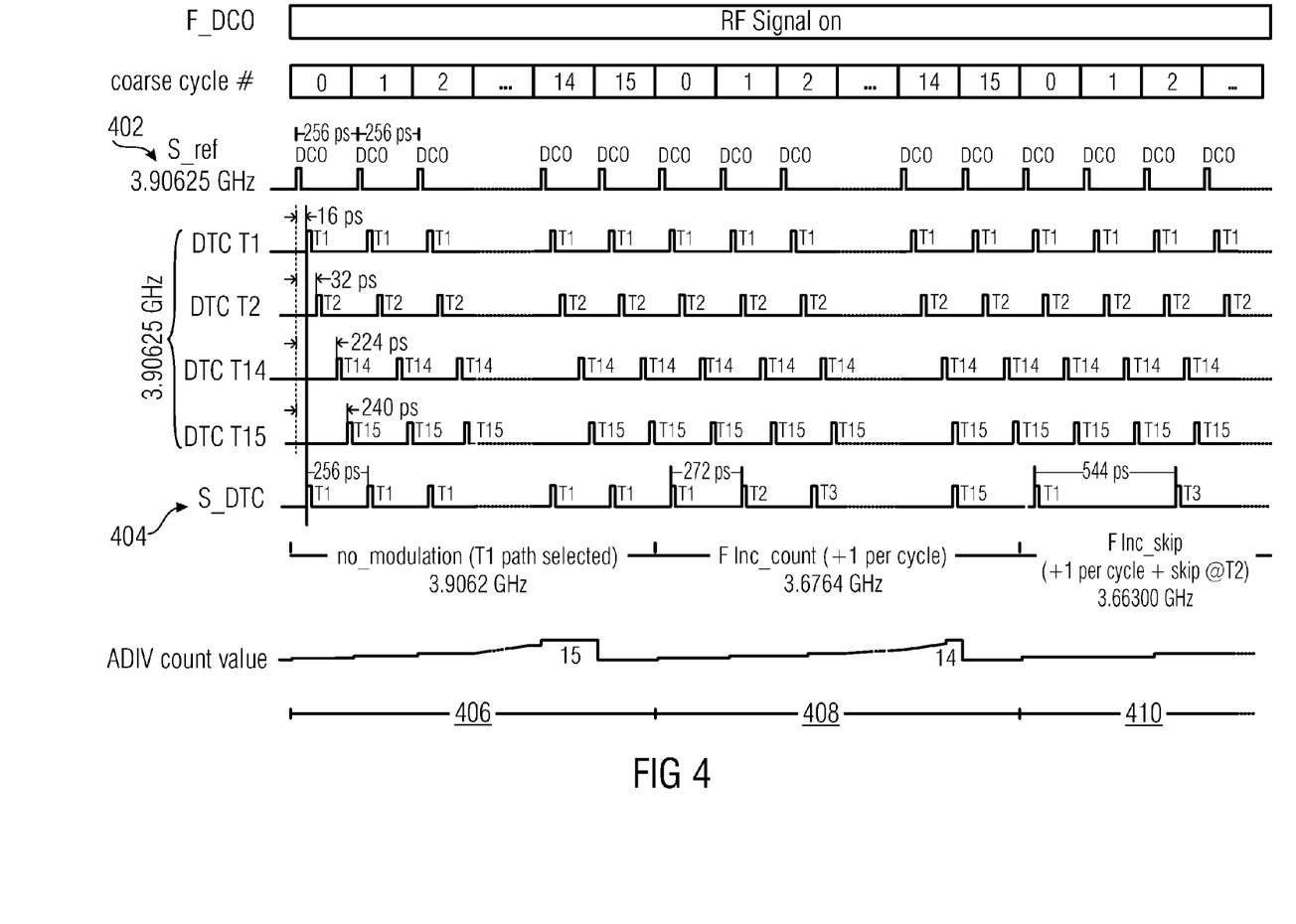
FIG. 4 illustrates a high resolution phase alignment circuit in accordance with some embodiments.

FIG. 4 shows waveforms illustrating one example of how a calibration mode can be carried out. In these waveform diagrams, pre-determined stimulus patterns are applied to the DTC to generate select different combinations of pulses and or edges having respective frequencies and/or phases. These frequencies and/or phases are measured and tabulated to determine the delay of the delays elements in the delay chain, such that the measured phases and/or frequencies can be used in subsequent transmission. It will be appreciated that the waveforms in FIG. 4 are but one non-limiting example of how pulses or edges can be set according to pre-determined patterns during calibration, and other examples are also possible.

As shown, a reference signal, S_ref 402, which can be provided by a reference generator (e.g., reference generator 102 in FIG. 2), has a frequency of about 3.90625 GHz. This reference signal S_ref, can be provided to a first input terminal of a DTC block (e.g., 106 in FIG. 2).

From this reference signal, delay elements in a DTC delay chain provide respective delayed signals T1, T2, . . . , T15. For example, a first delayed signal, T1, is delayed by approximately some predetermined time (e.g., 16 picoseconds (ps)) relative to the reference signal, S_ref, but still exhibits a period of about 256 picoseconds, which corresponds to the reference frequency of about 3.90625 GHz. A second delayed signal, T2, is delayed by approximately 16 ps relative to the first delayed signal T1; a third delayed signal, T3, is delayed by approximately 16 ps relative to the second delayed signal T2; and so on, until the end of the delay chain is reached. Thus, a number of delayed signals T1, . . . T15, can be provided by the delay chain, wherein each of the delayed signals has the same frequency as the reference signal but are successively delayed relative to one another.

An output DTC signal, S_DTC 404, is made up of pulses or edges from the delayed signals (T1, . . . , T15). Thus, S_DTC changes its frequency and phase depending on which pulses or edges are selected. S_DTC can be generated when a control block (e.g., DTC control block 110 in FIG. 2) provides a control signal to a selection block (e.g., selection block 112 in FIG. 2) to select one of more of the delayed signals.

For example, during a first time period 406, S_DTC includes only the first delayed signal T1, and the other delayed signals T2-T15 are not selected for inclusion in S_DTC. Thus, during the first time period 406, the S_DTC is made up of pulses separated by ~256 ps which establish a frequency of 3.90625 GHz. Because S_DTC corresponds to the first delayed signal T1 during the first time 406, time 406 may also be referred to as "no modulation" mode.

During a second time period 408, the selection block changes the control signal applied to pass the first delayed signal T1 in a first coarse cycle, the second delayed signal T2 in a second coarse cycle, a third delayed signal T3 in the third coarse cycle, and so on. Thus, during the second time period 408, adjacent pulses of the DTC signal are now separated by ~272 ps, such that the output DTC signal exhibits a frequency of ~3.6764 GHz. This time 408 may also be referred to as a continuously incrementing mode ($F_{INC\_CONT}$).

During a third time period 410, the selection block again changes the control signal to change the stimulus pattern applied to the DTC. In this time 410, S_DTC includes a first delayed signal T1 in a first coarse cycle, includes no delayed signals in a second coarse cycle (e.g., signals are "skipped"), includes a third delayed signal T3 in a third cycle, includes a fourth delayed signal T4 in a fourth cycle, and so on. Thus, during the third time period 410, only one pulse (e.g., T2) is skipped, such that the S_DTC signal exhibits a frequency of ~3.66300 GHz. This can also be referred to as an incremental mode with skipped pulses ($F_{INC\_SKIP}$).

For each time period 406, 408, 410, a phase/frequency measurement block (e.g., 206 in FIG. 2), which can include a frequency counter, counts the pulses of S_DTC for respective time periods. Thus, at the end of the first time period 406, the counter (e.g., 304 in FIG. 3), which increments for each pulse on S_DTC, has accumulated a value of 15. This value can be saved in a memory element as $F_{NO\_MOD}$, and can be used to adjust the overall delay of the DTC. Similarly, for the second time period 408 the counter again counts the pulses of S_DTC for one period, accumulating a value of 14. This value can be saved in a memory element as $F_{INC\_CONT}$. Similarly, for the third time period 410 (only a small portion of which is illustrated in FIG. 4), the pulses of S_DTC are counted and can be stored as $F_{INC\_SKIP}$. In typical implementations, $F_{INC\_SKIP}$ is measured for every single delay element in the delay chain.

After $F_{INC\_CONT}$ and $F_{INC\_SKIP}$ have been measured, the precise delay for one delay unit of the DTC can be determined according to:

$$T_{delayunit}=1/(F_{INC\_CONT}-F_{INC\_SKIP})$$

In typical implementations, when $F_{INC\_SKIP}$ is measured for every single delay element, the precise $_{delay}$ for each delay unit can be determined. Once the delays for each delay unit are known, they can be subsequently used to determine phase and/or frequency correction values used to adjust the original modulation control word to account for slight differences from expected frequencies and/or phases.

Figure 5:
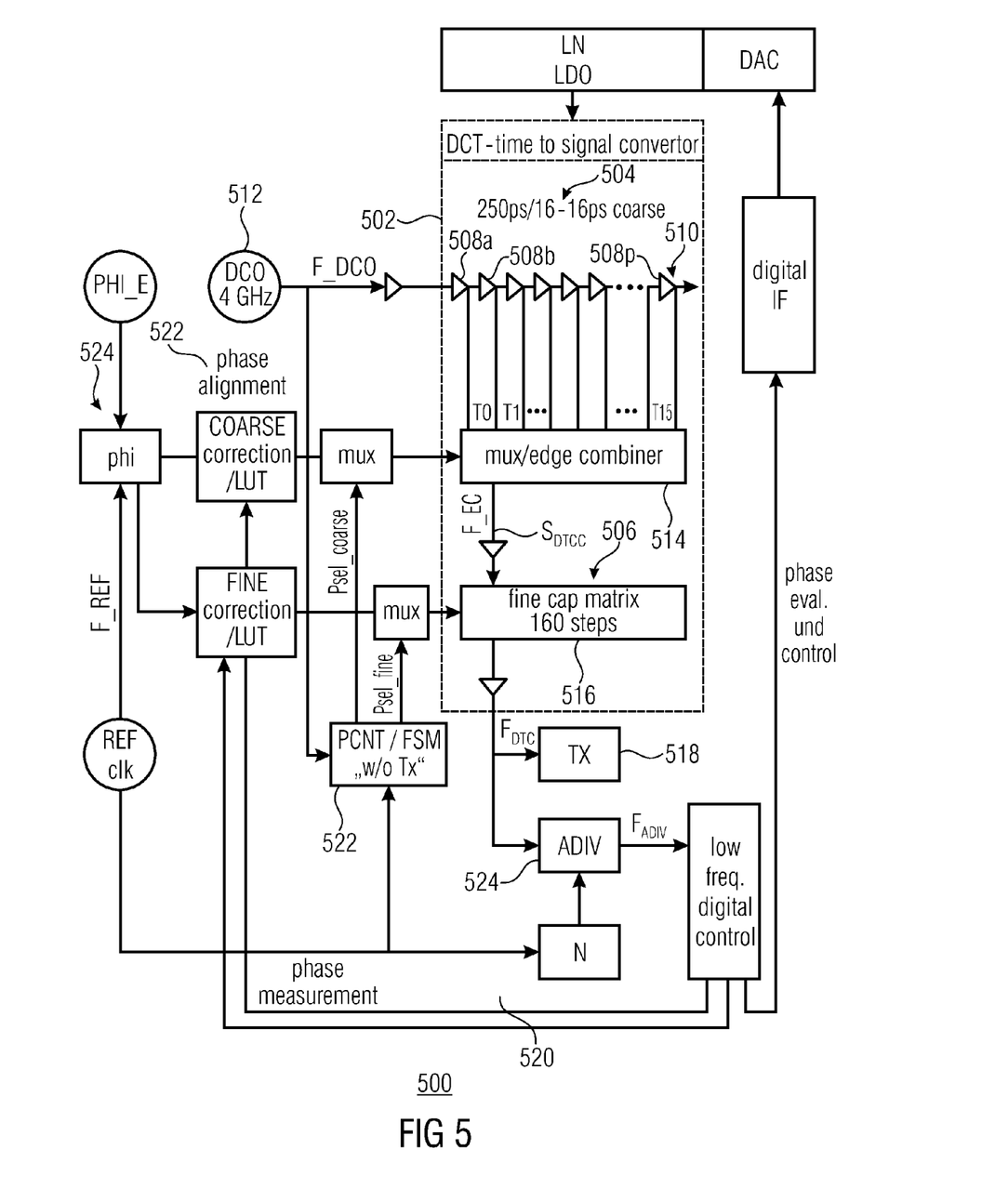
FIG. 5 is a waveform diagram illustrating one example of how calibration can be carried out for a high resolution phase alignment circuit in accordance with some embodiments.

This technique can also be applied for more complex DTCs. FIG. 5 shows another implementation of a high resolution phase alignment circuit 500 having a more complex DTC in accordance with some embodiments. This circuit 500 includes a DTC block 502 that has coarse tuning elements 504 and fine tuning elements 506. The coarse turning elements 404 are implemented as a number of delay elements 508a, 508b, . . . 508p arranged in series to form a delay chain 510. The delay elements 508 successively delay a reference signal from a DCO 512 to provide a number of successively delayed signals (T0, T1, . . . , T15). A selection block 514 selects different combinations of edges of the successively delayed signals (T0, T1, . . . , TN) to generate a coarse DTC signal, $S_{DTCC}$. The coarse DTC signal is then provided to a fine capacitor matrix 516, which further provides fine-tuning of the phase and/or frequency to better match the desired phase and/or frequency of the reference signal or modulated reference signal. This finely tuned DTC signal can then be provided to a transmission path 518 for wireless transmission via an antenna.

Because the circuit 500 can exhibit un-predictable phase or frequency variations due to process variation, temperature variation, supply voltage variation, and the like; the circuit 500 makes use of a calibration mode to limit these variations. Hence, to improve phase and frequency matching, a phase or frequency measurement block 520 measures the frequencies and/or phases of the DTC signal in time during calibration; and a phase control block 522 stores the different combinations of edges and their corresponding measured frequencies for later use.

During calibration, a parallel counter or finite state machine 522 in the phase control block applies predetermined patterns of control signals to a second terminal of the DTC to induce the DTC to output predetermined combinations of edges from delayed signals in the DTC. This generates a corresponding DTC signal on an output terminal of the DTC, where the DTC signal has a time-varying frequency or phase, depending on the edges that were selected. Although the predetermined combinations of edges are expected to exhibit a pre-determined phase and/or frequency, the phase and/or frequency can, in reality, vary because of process variation, temperature variation, and supply voltage variation, among others. Therefore, a counter 524 counts the pulses in the DTC signal to measure the phase and/or frequency of the DTC signal with high accuracy for later use.

Subsequently, during an active transmission mode, a modulation generator 526 can provide a modulation signal, $S_{mod}$, indicating a modulation to be applied to the reference signal, $S_{ref}$. Upon receiving the modulation signal, $S_{mod}$, the phase control block 522 can determine the required phase and/or frequency for a given time period based on the modulation signal, and can then lookup a combination of edges corresponding to the required phase and/or frequency. Because the calibration mode determines the phases and/or frequencies with extremely high precision, the active transmission mode can take advantage of these extremely precise measurements. This results in the transmission of precise signals from the transmitting arrangement 500.

Figure 8:
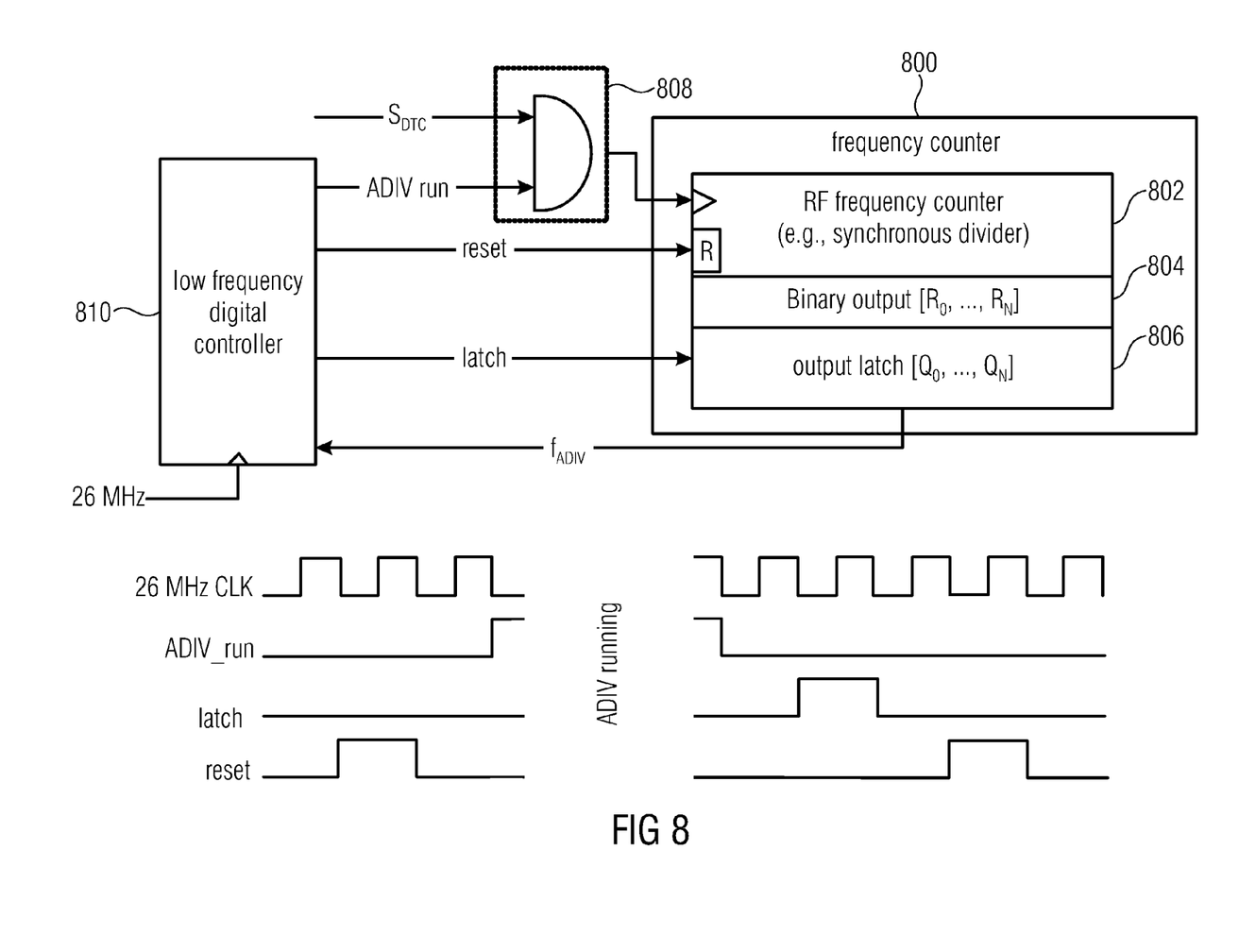
FIG. 8 is a block diagram of a frequency counter in accordance with some embodiments.

FIG. 8 shows one example of how a frequency counter 800 (e.g., ADIV counter 304 in FIG. 3 or 524 in FIG. 5) can be implemented. As shown in the top portion of FIG. 8, the frequency counter 800 includes an RF frequency counter 802, such as a synchronous divider for example as implemented as a chain of flip-flops. The frequency counter 802 has a reset terminal and an N-bit binary output 804 with bits R0, ..., RN. The binary output 804 is coupled to an N-bit output latch 806 with latch elements Q0, ..., QN.

During operation, the output $S_{DTC}$ signal is provided to an input terminal of a gating element 808 (e.g., logical AND gate), which also receives an frequency counter run signal, ADIV_run. The ADIV run signal remains in an active state (e.g., high state lower portion of FIG. 8) for a predetermined time during which pulses of the $S_{DTC}$ signal are to be counted. During this pre-determined time, the RF frequency counter 802 increments the binary output value 804 for each pulse of the $S_{DTC}$ signal. After the ADIV_run signal is de-asserted at the end of the predetermined measurement period, the RF frequency counter 802 stops incrementing due to its in-active clock, and the digital controller 810 pulses the latch signal to induce the output latch 806 to store the present binary output value R0, ..., RN. Subsequently, the controller 810 can reset the counter 802 by asserting the reset signal, which resets the frequency counter value so the frequency of the next predetermined measurement period can be measured.

Figure 6:
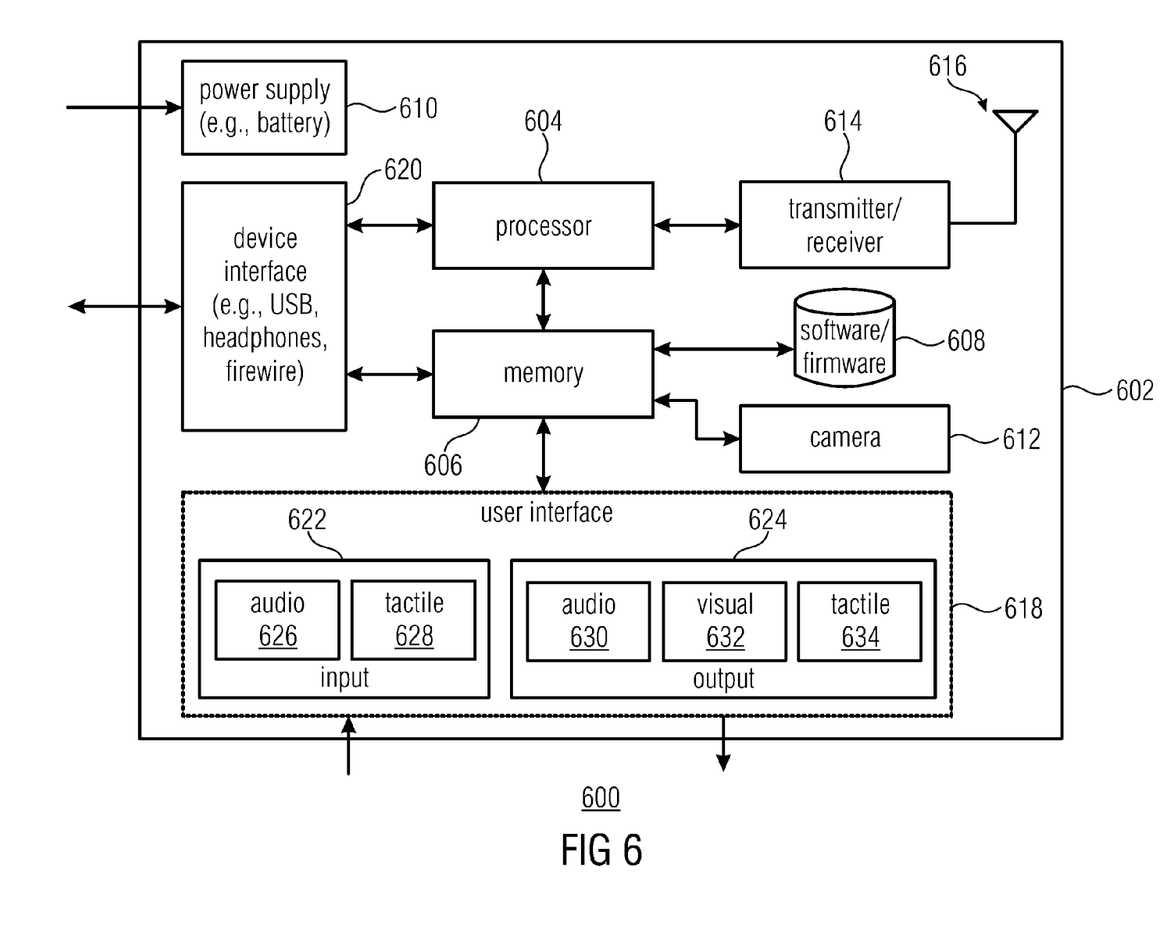
FIG. 6 is a block diagram illustrating a computing device, such as a mobile phone for example, in accordance with some embodiments.

FIG. 6 and the following discussion provide a brief, general description of a suitable computing device to implement embodiments of one or more of the provisions set forth herein. The computing device of FIG. 6 is only one example of a suitable operating environment and is not intended to suggest any limitation as to the scope of use or functionality of the operating environment. Example computing devices include, but are not limited to, mobile devices (such as mobile phones, Personal Digital Assistants (PDAs), media players, and the like), tablets, personal computers, server computers, hand-held or laptop devices, multiprocessor systems, consumer electronics, mini computers, mainframe computers, distributed computing environments that include any of the above systems or devices, and the like.

FIG. 6 illustrates an example of a system 600 comprising a computing device 602 configured to implement one or more embodiments provided herein. In one configuration, computing device 602 includes at least one processing unit 604 and memory 606. Depending on the exact configuration and type of computing device, memory 606 may be volatile (such as RAM, for example), non-volatile (such as ROM, flash memory, etc., for example) or some combination of the two. The memory 606 may be removable and/or non-removable, and may also include, but is not limited to, magnetic storage, optical storage, and the like. In some embodiments, computer readable instructions in the form of software or firmware 608 to implement one or more embodiments provided herein may be stored in memory 606. Memory 606 may also store other computer readable instructions to implement an operating system, an application program, and the like. Computer readable instructions may be loaded in memory 606 for execution by processing unit 604, for example. Other peripherals, such as a power supply 610 (e.g., battery) and a camera 612 can also be present.

The processing unit 604 and memory 606 work in coordinated fashion along with a transmitter and/or receiver 614 to wirelessly communicate with other devices. To facilitate this wireless communication, a wireless antenna 616 is coupled to the transmitter/receiver 614. During wireless communication, the transmitter/receiver 614 can use frequency modulation, amplitude modulation, phase modulation, and/or combinations thereof to communicate signals to another wireless device, such as a base station for example. The previously described high resolution phase alignment techniques are often implemented in the processor 604 and/or transmitter/receiver 614 (possibly in conjunction with memory 606 and software/firmware 608) to facilitate accurate data communication. However, the high resolution phase alignment techniques could also be used in other parts of the computing device.

To improve a user's interaction with the computing device 602, the computing device 602 may also include a number of interfaces that allow the computing device 602 to exchange information with the external environment. These interfaces can include one or more user interface(s) 618, and one or more device interface(s) 620, among others.

If present, user interface 618 can include any number of user inputs 622 that allow a user to input information into the computer device 602, and can also include any number of user outputs 624 that allow a user to receive information from the computer device 602. In some mobile phone embodiments, the user inputs 622 can include an audio input 626 (e.g., a microphone) and/or a tactile input 628 (e.g., push buttons and/or a keyboard). In some mobile phone embodiments, the user outputs 624 can include an audio output 630 (e.g., a speaker), a visual output 632 (e.g., an LCD or LED screen), and/or tactile output 634 (e.g., a vibrating buzzer), among others.

Device interface 620 allows device 612 to communicate with other electronic devices. Device interface 620 may include, but is not limited to, a modem, a Network Interface Card (NIC), an integrated network interface, a radio frequency transmitter/receiver, an infrared port, a USB connection, or other interfaces for connecting computing device 602 to other computing devices. Device connection(s) 620 may include a wired connection or a wireless connection. Device connection(s) 620 may transmit and/or receive communication media.

Figure 7:
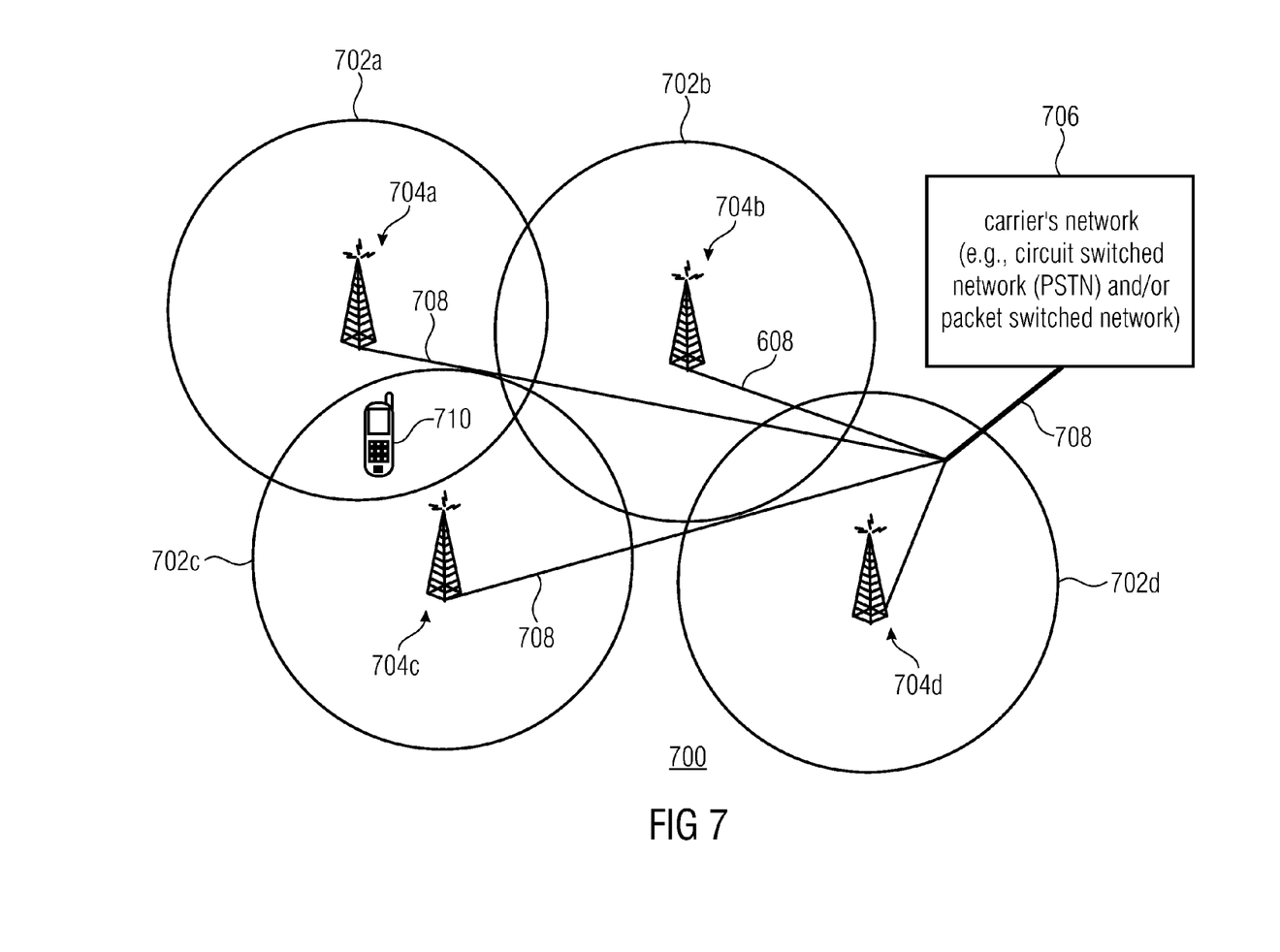
FIG. 7 is a block diagram illustrating a wireless network in accordance with some embodiments.

FIG. 7 shows one embodiment of a wireless network 700 over which a computing device (e.g., computing device 600 in FIG. 6) in accordance with this disclosure can communicate. The wireless network 700 is divided into a number of cells (e.g., 702a, 702b, ... 702d), wherein each cell has one or more base stations (e.g., 704a, 704b, ... 704d, respectively). Each base station can be coupled to a carrier's network 706 (e.g., a packet switched network, or a circuit switched network such as the public switched telephone network (PSTN)) via one or more wirelines 708.

A mobile handset 710 or other mobile device, while residing within a given cell, can establish communication with the base station within that cell via one or more of frequency channels used for communication in that cell. The communication between a mobile handset or other mobile device 610 and a corresponding base station often proceeds in accordance with an established standard communication protocol, such as LTE, GSM, CDMA or others. When a base station establishes communication with a mobile handset or other mobile device, the base station can establish communication with another external device via the carrier's network 706, which can then route communication though the phone network.

Those skilled in the art will realize that computing devices such as mobile phones can in many instances upload and download computer readable instructions from a network through the basestations. For example, a mobile handset or other mobile device 710 accessible via network 706 may store computer readable instructions to implement one or more embodiments provided herein. The mobile handset or other mobile device 710 may access a network and download a part or all of the computer readable instructions for execution.

The term "computer readable media" as used herein includes computer storage media. Computer storage media includes volatile and nonvolatile, removable and non-removable media implemented in any method or technology for storage of information such as computer readable instructions or other data. Memory (e.g., 606 in FIG. 6) is an example of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information. The term "computer readable media" may also include communication media. Communication media typically embodies computer readable instructions or other data in a "modulated data signal" such as a carrier wave or other transport component and includes any information delivery media. The term "modulated data signal" may include a signal that has one or more of its characteristics set or changed in such a manner as to encode information in the signal.

Although the disclosure has been shown and described with respect to one or more implementations, equivalent alterations and modifications will occur to others skilled in the art based upon a reading and understanding of this specification and the annexed drawings. Further, it will be appreciated that identifiers such as "first" and "second" do not imply any type of ordering or placement with respect to other elements; but rather "first" and "second" and other similar identifiers are just generic identifiers. In addition, it will be appreciated that the term "coupled" includes direct and indirect coupling. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A transmitting arrangement, comprising:
a digital to time converter (DTC) including a first DTC input terminal, a second DTC input terminal and an output DTC terminal, wherein the DTC comprises coarse tuning elements configured to generate a coarse DTC signal, and fine tuning elements configured to produce a finely tuned DTC signal, wherein the DTC comprises:
a number of delay elements arranged in series configured to successively delay a reference signal from the reference signal generator to provide a number of successively delayed signals, respectively;
a selection block configured to select different combinations of pulses or edges of the successively delayed signals to generate a DTC signal that exhibits a change in frequency over time depending on the pulses or edges that have been selected;
a reference signal generator coupled to the first DTC input terminal;
a modulation generator coupled to the second DTC input terminal;
a transmission path coupled to the output DTC terminal; and
a feedback path coupling the output DTC terminal to the second DTC input terminal.

2. The transmitting arrangement of claim 1, wherein the feedback path comprises:
a phase or frequency measurement block having an input coupled to the output DTC terminal; and
a phase correction block having a first input coupled to an output of the phase or frequency measurement block, having a second input coupled to the modulation generator, and having an output coupled to the second DTC input terminal.

3. The transmitting arrangement of claim 2, wherein the phase or frequency measurement block comprises a digital counter configured to count pulses of a DTC output signal provided on the output DTC terminal.

4. The transmitting arrangement of claim 3, wherein the phase correction block is configured to use the counted pulses of the DTC output signal from the digital counter to determine a phase or frequency correction word to adjust a modulation control word provided by the modulation generator.

5. The transmitting arrangement of claim 4, further comprising: a look-up table configured to store the phase or frequency correction word along with a corresponding modulation control word.

6. The transmitting arrangement of claim 5, wherein the phase correction block is configured to provide an adjusted modulation control word to the second terminal of the DTC based the modulation control word provided by the modulation generator and the phase or frequency correction word stored in the look-up table.

7. The transmitting arrangement of claim 1, wherein the modulation generator is configured to provide a digital modulation control word that specifies how a carrier signal from the reference generator is to be modulated.

8. The transmitting arrangement of claim 1, further comprising a multiplexer comprising:
a first input terminal coupled to the modulation generator;
a second input terminal coupled to the feedback path; and
an output terminal coupled to the second DTC input terminal.

9. The transmitting arrangement of claim 8:
wherein the multiplexer is configured to couple the feedback path to the second DTC input terminal during a calibration mode; and
wherein the multiplexer is configured to couple the modulation generator to the second DTC input terminal during an active transmission mode.

10. A phase alignment circuit, comprising:
a reference signal generator configured to provide a reference signal;
a digital to time converter (DTC) comprising:
  a number of delay elements arranged in series configured to successively delay the reference signal to provide a number of successively delayed signals, respectively;
  a selection block configured to select different combinations of pulses or edges of the successively delayed signals to generate a DTC signal that exhibits a change in frequency over time depending on the pulses or edges that have been selected;
a phase or frequency measurement block configured to measure the frequencies of the DTC signal over time; and
a phase alignment block configured to store the different combinations of pulses or edges and their corresponding measured frequencies for later use.

11. The phase alignment circuit of claim 10, wherein the number of successively delayed signals are phase shifted relative to one another but share the same frequency.

12. The phase alignment circuit of claim 10, further comprising:
a modulation element configured to provide a modulation control word according to which the reference signal is to be modulated to thereby generate a transmission signal at a predetermined frequency and phase;
wherein the phase alignment block is configured to adjust the modulation control word based on the combinations of pulses or edges, and is further configured to provide the adjusted modulation control word to the DTC to generate the transmission signal at the predetermined frequency and phase.

13. The phase alignment circuit of claim 10, wherein the phase or frequency measurement block comprises a frequency counter.

14. The phase alignment circuit of claim 13, wherein a reference clock coupled to a variable divider sets a counting period for the frequency counter.

15. The phase alignment circuit of claim 10, wherein the DTC includes fine control and coarse control.

* * * * *